(12) United States Patent
Bray et al.

(10) Patent No.: US 8,346,326 B2
(45) Date of Patent: Jan. 1, 2013

(54) SUPERCONDUCTIVE WIRE, PROCESSES OF MANUFACTURE AND USES THEREOF

(75) Inventors: James William Bray, Niskayuna, NY (US); Evangelos Trifon Laskaris, Schenectady, NY (US); Kiruba Sivasubramaniam, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 901 days.

(21) Appl. No.: 12/015,817

(22) Filed: Jan. 17, 2008

(65) Prior Publication Data

US 2009/0186769 A1 Jul. 23, 2009

(51) Int. Cl.
*H01L 39/24* (2006.01)

(52) U.S. Cl. ..... 505/230; 505/925; 174/15.5; 228/173.5

(58) Field of Classification Search ............ 505/230, 505/925; 174/15.5; 228/173.5
See application file for complete search history.

(56) References Cited

U.S. PATENT DOCUMENTS

| | | | |
|---|---|---|---|
| 4,047,063 A | 9/1977 | Reece et al. | |
| 6,295,716 B1 * | 10/2001 | Rupich et al. | ............ 29/599 |
| 6,570,290 B2 | 5/2003 | Kazmierczak | |
| 6,777,841 B2 | 8/2004 | Steinmeyer | |
| 6,794,732 B2 | 9/2004 | Wang | |
| 6,844,655 B2 | 1/2005 | Kaminski et al. | |
| 7,030,535 B2 | 4/2006 | Wang | |
| 7,049,724 B2 | 5/2006 | Qu et al. | |
| 7,226,894 B2 | 6/2007 | Raber et al. | |
| 7,397,142 B1 * | 7/2008 | Cooper | ............ 290/44 |
| 2002/0113336 A1 * | 8/2002 | Cass et al. | ............ 264/187 |
| 2003/0020361 A1 | 1/2003 | Kaminski et al. | |
| 2003/0036482 A1 * | 2/2003 | Thieme et al. | ............ 505/100 |
| 2003/0184176 A1 | 10/2003 | Steinmeyer | |
| 2004/0026927 A1 * | 2/2004 | Stevenson et al. | ........ 290/40 C |
| 2004/0212258 A1 | 10/2004 | Laskaris et al. | |
| 2004/0239201 A1 | 12/2004 | Sivasubramaniam et al. | |
| 2005/0194862 A1 | 9/2005 | Qu et al. | |
| 2006/0028085 A1 * | 2/2006 | Qu et al. | ............ 310/178 |
| 2006/0066429 A1 * | 3/2006 | Kasten | ............ 335/296 |
| 2007/0085427 A1 | 4/2007 | Sivasubramaniam et al. | |
| 2007/0120435 A1 | 5/2007 | Laskaris et al. | |

* cited by examiner

*Primary Examiner* — Paul Wartalowicz
(74) *Attorney, Agent, or Firm* — Ann M. Agosti

(57) ABSTRACT

An electrical component comprises a superconductive wire, the wire comprising a first wire segment joined to a second wire segment, wherein the first wire segment and the second wire segment differ in at least one property selected from the group consisting of magnetic field tolerance, temperature tolerance, ac loss, and strain tolerance, and wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

11 Claims, 6 Drawing Sheets

SUPERCONDUCTIVE WIRE, PROCESSES OF MANUFACTURE AND USES THEREOF

BACKGROUND OF THE INVENTION

The present disclosure relates generally to superconductive wire, methods of manufacture, and uses thereof in electronic components.

Typical superconductive (SC) rotating machines such as electrical motors and generators comprise a SC field coil and non-superconductive armature windings located, for example, on a stationary stator. When supplied a voltage, the field coil generates a magnetic field coupling the field coil and the armature windings. The magnitude of the coupling magnetic field is determined by the amount of current passed through the field coil and to a lesser extent by the armature reaction current from the load. The magnetic stress within the machine translates to torque resulting in rotation of the rotor. The higher the magnetic field, the greater the torque per rotation for a given circumference of armature windings and air gap surface area. Although the armature windings can also be superconductive, they are usually formed of non-SC material such as copper.

In established commercial superconductive (SC) wires, such as NbTi or $Nb_3Sn$, the current carrying capacity is a function of the critical current Ic, the current where the material has a phase transition from a superconductive phase to a non-superconductive phase. Ic is a decreasing function of temperature T and magnetic field H. These SC wires also differ in price and manufacturing cost; for example, NbTi has a lower price and manufacturing cost, but also lower Ic than $Nb_3Sn$. Superconductors also have a transition from the superconductive to non-superconductive phase at a transition temperature Tc and a critical field Hc, and it follows that they must be operated below this temperature and field.

In SC field coils, such as those used in SC electric motors and generators, the magnetic field H varies with location on the field coil, usually being higher at the inner parts of the coil, such as the inner surface or bore of a solenoid. Herein, the inner part of the field coil is referred to as the high-field region and the outer part of the coil, such as the outer surface of a solenoid, is referred to as the low-field region. One drawback of SC materials used to manufacture field coils is that some are more tolerant of the magnetic field than others. Less tolerant materials also tolerate lower current, which translates to weaker magnetic field strengths and less torque per given weight of SC material.

An ongoing need in superconductive rotating motors is reduction in the size and weight of the machines; that is, increasing the torque density for a given circumference of the field coil and armature windings. The practical benefits from miniaturization through more field tolerant electrical components in these and other machines include lower manufacturing costs, among others. This disclosure addresses the need for more field tolerant components.

BRIEF DESCRIPTION OF THE INVENTION

Disclosed herein are functionally graded superconductive wires for electrical components such as, for example, superconductive field coils for motors and generators.

In one embodiment, an electrical component comprises a superconductive wire, the wire comprising a first wire segment joined to a second wire segment; wherein the first wire segment and the second wire segment differ in at least one property selected from the group consisting of magnetic field tolerance, temperature tolerance, ac loss, and strain tolerance; and wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

In one embodiment, a process of forming a superconductive field coil, comprises winding a first wire segment; joining a second wire segment to the first wire segment; and winding the second wire segment about the first wire segment, wherein the first wire segment and the second wire segment differ in at least one property selected from the group consisting of magnetic field tolerance, temperature tolerance, ac loss, and strain tolerance; and wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

In one embodiment, a machine comprises an electrical component comprising a superconductive wire, the wire comprising n wire segments joined by n−1 joints; wherein n is an integer greater than or equal to 2; and wherein adjacent wire segments differ in at least one property selected from the group consisting of magnetic field tolerance, temperature tolerance, ac loss, and strain tolerance; and wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

Other features and advantages will be or become apparent to one with skill in the art upon examination of the following drawings and detailed description.

BRIEF DESCRIPTION OF THE DRAWINGS

In the drawings, like reference numerals designate corresponding parts throughout the several views.

DETAILED DESCRIPTION OF THE INVENTION

Disclosed herein are functionally graded superconductive wires for electrical components of power equipment such as motors and generators and other electrical machines. The superconductive wires comprise n wire segments joined by n−1 joints, wherein n is an integer greater than or equal to 2. Functional grading refers to adjacent wire segments having different properties with respect to at least one of magnetic field tolerance, temperature tolerance, ac loss, and strain tolerance. The functionally graded superconductive wire (herein "superconductive wire") can enhance, for example, the magnetic field capability of an electrical component such as a superconductive field coil of a motor or generator, allowing it to operate at higher current and generate greater magnetic stress, and advantageously produce increased torque per rotation of a given circumference of the armature windings and air gap surface area compared to a superconductive field coil comprising a non-functionally graded wire.

In one embodiment an electrical component comprises a superconductive wire, the wire comprising a first wire segment joined to a second wire segment; wherein the first wire segment and the second wire segment differ in at least one property selected from the group consisting of magnetic field tolerance, temperature tolerance, ac loss, and strain tolerance, wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

In one embodiment, the first and second wire segments are formed of different superconductive compositions. In one embodiment the superconductive wire comprises at least one additional wire segment joined to the second wire segment; wherein adjacent wire segments differ in at least one of the aforementioned properties. In one embodiment the electrical component comprises a plurality of adjacent layers or lengths of the superconductive wire. In one embodiment, the electrical component is a cable or a coil.

Figure 1:
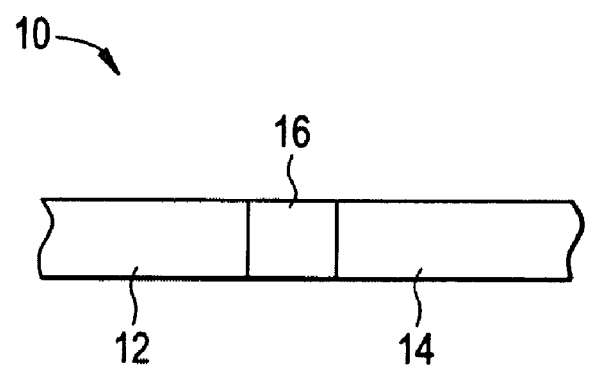
FIG. 1 is a schematic of a functionally graded superconductive wire for an electrical component.

FIG. 1 illustrates a superconductive wire 10 wherein n equals 2, comprising a first wire segment 12, a second wire segment 14, and joint 16 linking first wire segment 12 to second wire segment 14. The superconductive wire can comprise any number of wire segments so long as adjacent wire segments differ in at least one of magnetic field tolerance, temperature tolerance, ac loss, or strain tolerance, and the performance of the superconductive wire is not adversely affected by the additional wire segments. Adjacent segments can have different superconductive compositions, or comprise different morphologies of the same composition that express different Ic(H) behavior.

Figure 2:
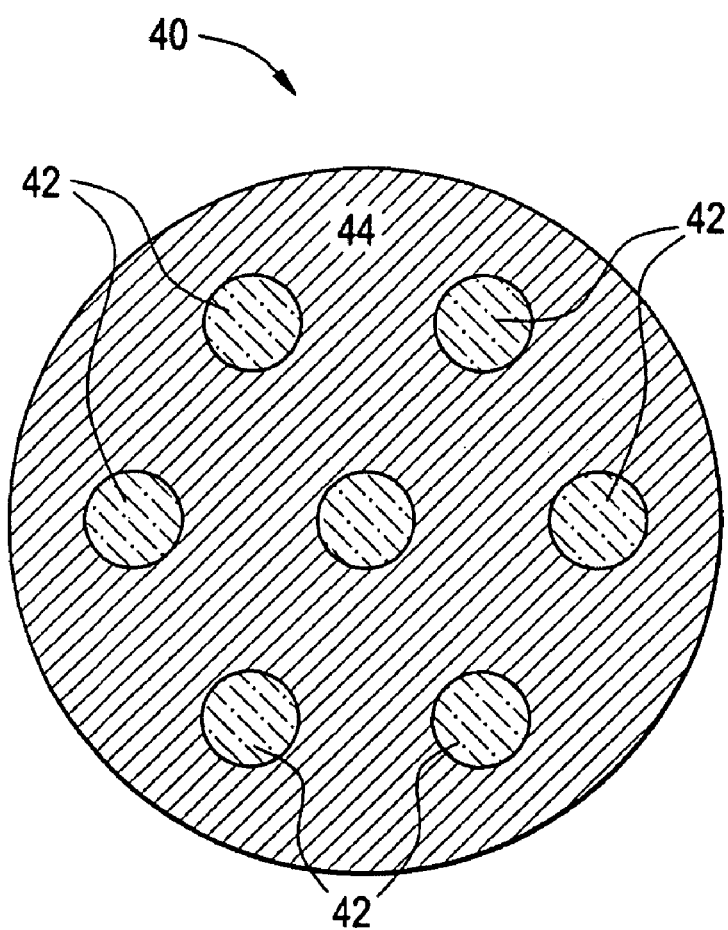
FIG. 2 is a schematic cross-section of an exemplary wire segment comprising several superconductive filaments.

FIG. 2 is a schematic representing a cross-sectional view of an exemplary wire segment 40. Wire segment 40 includes at least one superconductive filament 42 comprising a superconductive composition. Although seven such filaments 42 are represented in the FIG. 2, there is no limit to the number of filaments 42 contained within wire segment 40. In one embodiment as shown in the FIG. 2, at least a portion of the filaments are encapsulated in an optional metal matrix 44, which facilitates the establishment of continuous length of superconductive filament.

In another exemplary embodiment (not shown), the wire segment 40 does not have a metal matrix 44 and consists essentially of one or more bundled superconductive filaments 42 comprising a superconductive composition.

Exemplary superconductive compositions include NbTi, $Nb_3Sn$, $MgB_2$, $YBa_2Cu_3O_7$ (referred to as YBCO), bismuth-strontium-calcium-copper-oxygen compounds such as BSCCO-2223 ($Bi_2Sr_2Ca_2Cu_3O_{10}$), BSCCO-2212 ($Bi_2Sr_2Ca_1Cu_2O_8$), $TlBa_2Ca_2Cu_3O_9$, $Tl_2Ba_2CaCu_2O_8$, $(TlPb)Sr_2CaCu_2O_7$, $(TlPb)Sr_2Ca_2Cu_3O_9$, and combinations thereof.

The superconductive compositions can further comprise dopants. The dopants in addition to providing metallic phase support can be incorporated for purposes of changing lattice configurations or spacing and/or improving superconductive properties. Depending upon the chemical composition of the first superconductive phase, useful dopants that can be added include copper, gold, silver, magnesium, zinc, lead, iron, cadmium, tin, bismuth, gallium, mercury and indium or a combination comprising at least one of the foregoing dopants.

Irrespective of the other components present in the superconductive composition, the superconductive composition has a superconductive phase in a volume fraction effective to provide superconductivity at an operative critical temperature. In one embodiment, the superconductive phase can occupy a volume greater than or equal to about 19 volume percent of the total superconductive composition. It is generally preferred for the volume fraction of the first superconductive phase to be present in an amount of greater than or equal to about 25, more particularly greater than or equal to about 35, still more particularly greater than or equal to about 50, and even more particularly greater than or equal to about 75 volume percent of the total superconductive composition.

A wire segment comprises at least one superconductive filament having a filament characteristic dimensions wherein the filament is continuous. The metallic matrix material 44 surrounding the superconductive filament is optional, but when used can be either electrically non-conductive or conductive at cryogenic temperatures (i.e., below about 77 K). In order to prevent breakage of wire segment 40 during cycling between room temperature and cryogenic temperatures, the metallic matrix 44 has a coefficient of thermal expansion that is substantially the same as or greater than that of the superconductive composition.

The metal matrix can be a tube, a billet, and the like, having holes into which either the superconductive composition or the precursors to the superconductive composition (such as Nb and Ti or Sn, or magnesium and boron) can be deposited. In an optional embodiment, the metal matrix is comprised of copper or a copper alloy, with a second metal layer disposed between the superconductive composition and the copper. The second metal layer is either a barrier layer or a high resistivity layer. In one embodiment, the barrier layer is selected from the group consisting of tantalum, niobium, nickel, nickel alloys, iron, tungsten, molybdenum and combinations thereof. In another embodiment, the resistivity layer is selected from the group consisting of cobalt, manganese, a nickel titanium alloy or a nickel zirconium alloy.

If the tube has more than one hole, it is generally desirable for the holes to have the same average radius. The radiuses of the individual holes do not, however, always have to be equal to another. In addition the holes can have any desired geometry. For example while the geometrical cross-section of one hole is circular, the other can be elliptical, and so on. The ratio of the radius of any one hole to the radius of the tube can be about 0.1 to about 0.99. Within this range, a ratio of greater than or equal to about 0.15, more particularly greater than or equal to about 0.2, and even more particularly greater than or equal to about 0.25 is desirable.

Filaments having the superconductive composition can be manufactured by a number of different methods. In one exemplary method of manufacturing the superconductive composition in the form of a wire, the metallic tube having at least one cylindrical hole through its length is filled with the superconductive composition and is then subjected to a deformation process to reduce the cross-sectional area of the tube as well as to increase its length. In an exemplary embodiment, the superconductive composition comprises NbTi or $Nb_3Sn$. The metallic tube can have any number of non-intersecting holes that extend from a first end of the tube through to the second end of the tube and at least one of these holes is filled with the superconductive composition prior to the elongation process. The first end and the second end of the tube are each located at a diametrical cross-section of the tube. It is generally desirable for the particles that constitute the superconductive composition to be in electrical communication with at least one other particle of the powder prior to the deformation process.

The metallic tube containing the superconductive composition is then sealed prior to the deformation. The deformation can involve processes such as extrusion, forging, rolling, swaging, drawing, and the like, as well as combinations comprising at least one of the foregoing processes. The deformation is conducted to extend the length of the tube and to reduce the cross-sectional area. It is generally desirable for the change in length per deformation process to be greater than or equal to about 5%, based on the original length of the tube. In general a change is length of greater than or equal to about 10, more particularly greater than or equal to about 50, and even more particularly greater than or equal to about 100% of the original length is desirable. The deformation of the tube is generally conducted in such a manner so as to permit the particles of the superconductive composition in the hole to be in continuous electrical communication with one another to form the filament 110.

The tube is generally deformed to form a superconductive wire having a cross sectional area of about 0.1 $mm^2$ to about 5 $mm^2$. Within this range, cross sectional areas of greater than or equal to about 0.2 $mm^2$, more particularly greater than or equal to about 0.3 $mm^2$, and even more particularly greater than or equal to about 0.5 $mm^2$, can be used. Also desirable within this range are cross sectional areas of less than or equal to about 4.5 $mm^2$, more particularly less than or equal to about 4.2 $mm^2$, and even more particularly less than or equal to about 3.5 $mm^2$. In general, the metal matrix comprises about 20% to about 80% of the cross-sectional area of the wire segment. Within this range, the metal matrix can comprise cross sectional areas of greater than or equal to about 25%, more particularly greater than or equal to about 30%, and even more particularly greater than or equal to about 35%, of the superconductive wire. The metal matrix can also comprise a cross sectional area of less than or equal to about 75%, more particularly less than or equal to about 70%, and even more particularly less than or equal to about 65%, of the wire segment. The wire segment can be further flattened to a tape or film if desired.

Following the deformation process, the wire segment, tape or film can be heat treated to improve the superconductive properties and/or the mechanical properties. The heat treatment process involves heating the wire segment to a temperature of greater than or equal to about 600° C., more particularly greater than or equal to about 800° C., and even more particularly greater than or equal to about 900° C. The time period for the heat treatment is about 1 to about 6 hours. More particularly, the period for the heat treatment is greater than or equal to about 2 hours. In general, the wire segment upon cooling provides the resulting superconductive composition with the structure effective for displaying superconductive properties.

In another exemplary method of manufacturing, the wire segment comprising a metallic tube having at least one hole is filled with materials used to make a superconductive composition along with any desired dopants. Exemplary dopants include copper, gold, silver, magnesium, zinc, lead, cadmium, tin, bismuth, gallium, mercury, indium or combinations comprising at least one of the foregoing metals. The tube is then sealed and subjected to deformation, as noted above. The wire segment is then heat treated to temperatures of greater than or equal to about 700° C. to produce the superconductive composition in the wire segment. As noted above, the wire segment can be drawn into a film, tape, or the like.

In yet another exemplary method of manufacturing the wire segment, a suitable metallic tube in the form of a billet having at least one hole is filled with magnesium rods, pellets, powder, particles, flakes, and the like. Dopants such as those listed above can also be added into the hole along with the rods, pellets, powder, particles, flakes, and the like of materials used to make the superconductive composition. The metallic tube can be a metal that does not form a complex upon exposure to a dopant. In addition the metallic tube can be a metal that permits the diffusion of the dopant through it within a reasonable time period. Suitable examples of the metal used in the metallic tube (billet) for this manner of manufacturing the wire segment are a copper alloy, stainless steel, tantalum, magnesium or an oxide dispersion strengthened copper and nickel alloys.

The metallic tube is then sealed and subjected to deformation to produce a wire segment having a reduced cross-sectional area and increased length. It is desirable for the metal to exist in the form of a continuous filament having a length equal to that of the wire segment. This permits the formation of a filament having a superconductive composition through the entire length of the wire segment upon exposure of the wire segment to a dopant.

In order to form the superconductive composition, the wire segment containing the filament is contacted with dopant to permit the diffusion of the dopant into the metal and eventually upon heat treatment of the wire segment to form a superconductive composition. It is generally desirable for the wire segment to have the ability to continuously superconduct electricity from a first end to the second end and also for the length of the superconductive filament to be at least equal to or greater than the distance from the first end to the second end of the wire segment. In yet another embodiment, any of the aforementioned methods of preparing the wire segment can be combined to either produce the wire segment or to improve its properties.

Each wire segment of the superconductive wire can be of any desired length. More particularly, the wire segments have a length of about 1 meter to about 1000 meters. Within this range it is generally desirable to have a length of greater than or equal to about 2 meters, more particularly greater than or equal to about 5 meters, and even more particularly greater than or equal to about 8 meters. Also desirable within this range is a length of less than or equal to about 900 meters, more particularly less than or equal to about 800 meters and even more particularly less than or equal to about 500 meters.

Following the manufacturing of a wire segment, the wire segments can be joined by welds or diffusion bonding to produce a continuous length of superconductive wire having a length at least equal to the sum of the lengths of each of the wire segments. In one embodiment, the joining of a first wire segment to a second wire segment produces a superconductive wire having a length greater than or equal to the length of the first wire segment or the length of the second wire segment.

Diffusion bonding is a solid phase process achieved via atomic migration with no macro-deformation of the portions of the wire segments to be bonded. Initial cleanliness of the wire segments is desirable. Surface roughness values of less than 0.4 microns are desirable and the samples can be cleaned in acetone or another solvent prior to bonding. Pressure can be used if desired to affect the diffusion bonding.

In one embodiment, the joining involves contacting a first end of a first wire segment to a second end of a second wire segment; heating the first end of the first wire segment with the second end of the second wire segment at a point to form a single wire, wherein the superconductive filament having the superconductive composition is in continuous electrical contact with any other part of the superconductive filament. The point at which the two wires are heated can be a single spot or it can be a section at which the two wires overlap. The joint can be a spot weld or a butt weld, or any other kind of weld desired. In one embodiment the weld is formed during the winding process of manufacturing the field coil.

In one embodiment, it is generally desired to join the wire segments in a manner effective to have at least one electrically continuous superconductive filament of a length greater than or equal to the length of the joined wire segments.

The joining is generally carried out using at least one source of energy, such as, the energy provided by a beam of light, wherein the energy provided by the source is directed at those portions of the superconductive composition that are to be joined together. The interaction of the energy with the superconductive composition facilitates the heating of the composition, and this increase in the temperature can be advantageously utilized to facilitate the joining of the superconductive composition. Preferable methods of joining are electron beam welding, laser welding, ultrasonic welding, plasma arc welding, resistance welding and the like.

In the process of joining a wire segment having a metal matrix, the metal matrix may first be removed to expose the superconductive composition in the wire segments that are to be joined. The metal matrix can be removed by methods such as chemical etching, mechanical abrasion such as polishing and grinding, thermal treatments such as melting of degradation, or the like, or combinations comprising at least one of the foregoing methods. Following the removal of the metal matrix, the exposed ends of the superconductive filament can be optionally cleaned with a solvent if desired. The exposed portion of the superconductive filament is then heated by contacting it with a source of energy such as an electron beam, laser beam, plasma arc, resistance heating and the like. The heated portions of the superconductive filaments are then joined together and cooled to form a weld. In one embodiment, the heated superconductive filaments are joined together under pressure. In another embodiment, the joining is generally conducted in an inert atmosphere to prevent oxidation of the superconductive composition in the superconductive filaments.

In another embodiment, after the metal matrix is removed from the ends of the superconductive wire to be joined, the two ends are brought together to form an overlapping section. A filler material or dopant can be placed on the overlapping section. The overlapping section is then joined using one of the aforementioned joining methods to form a continuous section of the superconductive filament.

In yet another embodiment, the overlapping section comprising the exposed ends of the superconductive filaments along with a filler material, for example powdered NbTi or $Nb_3Sn$, are resistively heated. The heating promotes a chemical reaction between the filler material and the substrate filament. The filler material can be used to facilitate the joining of the superconductive filament segments.

In one embodiment, the joining generally occurs at a temperature of about 650° C. to about 1000° C. Within this range, a temperature of greater than or equal to about 700° C., more particularly greater than or equal to about 725° C., and even more particularly greater than or equal to about 750° C., can be used. Also desirable are temperatures of less than or equal to about 950° C., more particularly less than or equal to about 900° C., and even more particularly less than or equal to about 875° C. An exemplary temperature is about 795° C. to about 850° C.

Also disclosed are electrical machines comprising an electrical component comprising a superconductive wire, the wire comprising n wire segments joined by n−1 joints; wherein n is an integer greater than or equal to 2; and wherein adjacent wire segments differ in at least one property selected from the group consisting of magnetic field tolerance, temperature tolerance, ac loss, and strain tolerance; wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

Figure 3:
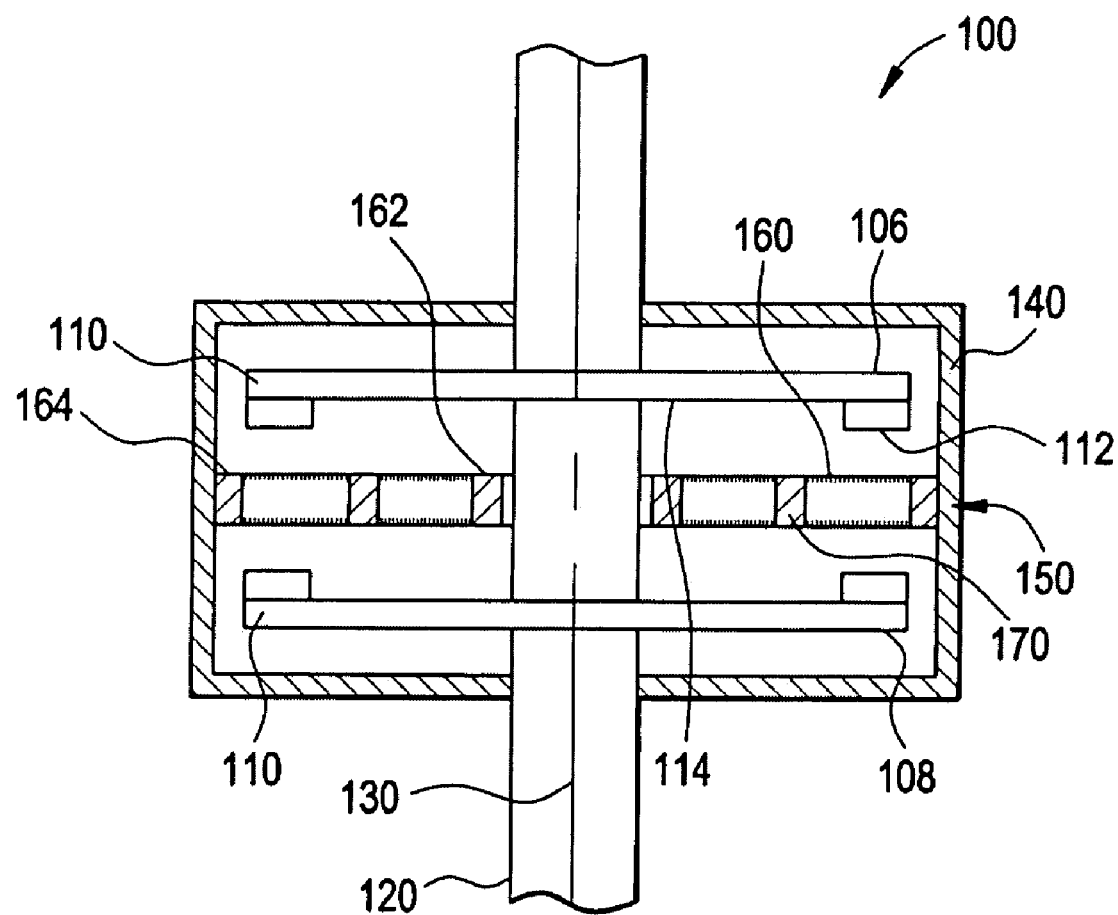
FIG. 3 is a cross-sectional view of an exemplary machine having a rotatable shaft and a stator.

FIG. 3 is a schematic cross-sectional view of a non-limiting example of a machine 100 comprising an electrical component in the form of a field coil comprising a superconductive wire. The machine 100 can operate as a motor and/or as a generator as desired. The machine 100 includes a rotor assembly 110 having a pair of rotor segments 106, 108 mounted on a shaft 120. The shaft 120 can be formed of any material, more particularly of a non-ferromagnetic material, such as stainless steel. The rotor segments 106, 108 are adapted to rotate as the shaft rotates about its longitudinal axis 130 and are spaced-apart axially along the shaft 120. Each rotor segment 106, 108 includes a plurality of salient poles, such as iron poles 112 and a plurality of air poles 114.

The rotor assembly 110 is substantially enclosed within a stationary housing 140. The housing 140 rotatably supports the rotor assembly 110. The housing 140 is of a substantially cylindrical configuration. A stator assembly 150 is also supported within the housing 140 and is stationary relative to the housing 140. The stator assembly 150 includes a stator 160 having stator windings (not shown) and a stationary field coil 170 comprising the functionally graded superconductive wire. In particular, the field coil 170 is mounted on the stator 160.

The field coil 170 is mechanically decoupled from the rotor assembly 110. The field coil 170, when cooled to superconductive temperatures, has substantially zero resistance to electrical current flow. The field coil 170 and the salient poles 112 are configured relative to each other such that a rotating magnetic field with a substantially axial air gap flux is produced when the rotor segments 106, 108 are rotated relative to the stator 160 around a predetermined axis. In a preferred embodiment where the rotor segments are mounted on the shaft 120, the air gap flux direction is substantially parallel to the longitudinal axis 130 of the shaft 120.

Thus, the rotor and the stator are offset axially with the field coil being stationary relative to the stator. The poles of the rotor are formed on a planar surface that is substantially perpendicular to the rotational axis of the rotor. Further, the superconductive field coil is positioned in plane that is axially offset from the plane of the poles of the rotor. With the rotation of the rotor through a magnetic field generated by the field coil, a rotating magnetic field is produced. The rotating magnetic field has an air gap flux substantially in the axial direction in the region of the stator.

In operation, the machine 100 can operate as an electrical generator or as a motor. When the machine 100 operates as a generator, the shaft 120 and the rotor assembly 110 are rotated about the longitudinal axis 130 of the shaft 120. The rotation of the shaft 120 and the rotor assembly 110 can be performed by applying a torsional force coupled to the shaft 120. The field coil 170 is cooled to the superconducting state at a temperature below its transition temperature Tc. When an electrical current is supplied to the field coil 170 it acts as a stationary magnetomotive force (MMF) source which interacts with a rotating permeance wave of the rotating poles of the rotor to produce a rotating AC magnetic field. The rotating magnetic field has an air gap flux directed substantially axially along the longitudinal axis 130 of the shaft 120 and is magnetically coupled to the stator (aperture) windings (not shown) which allows electrical power to be generated.

When the machine 100 operates as a motor, electrical current is provided to the field coil 170 of machine 100 to generate a rotating magnetic field coupling the field coil 170 and stator (armature) windings. By doing so a magnetic stress is increased within the machine, resulting in a torque on the rotor assembly 110 causing shaft 120 to rotate relative to the stator 160.

In the exemplary embodiment, the field coil 170 is stationary relative to the housing 140, while the rotor assembly 110 rotates relative to the housing 140 such that a relative difference in rotational speed between the rotor assembly 110 and the magnetic field generated by the field coil 170 is the rotational speed of rotor 110.

Figure 4:
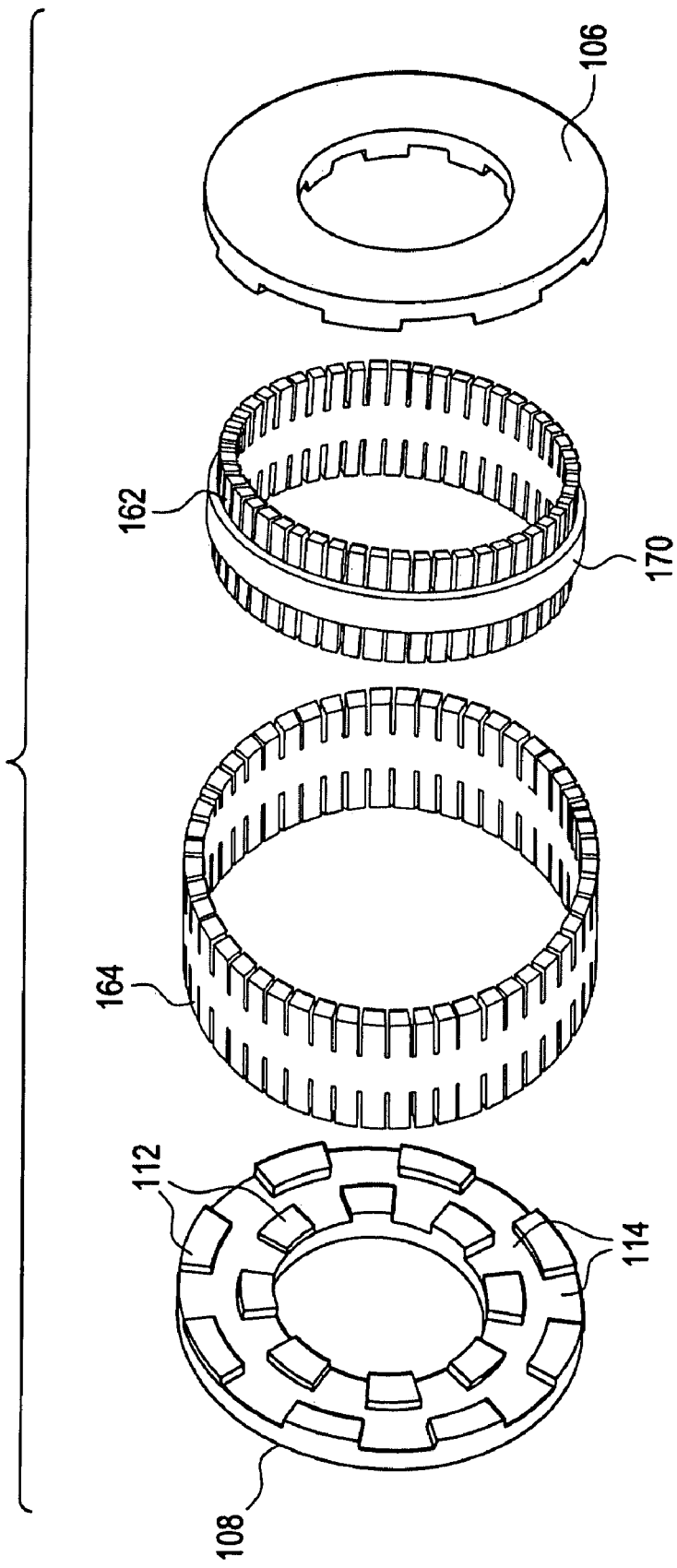
FIG. 4 is a perspective view of an exemplary stator showing a field coil on the inner stator.

FIG. 4 illustrates a three dimensional view of the machine 100 according to an embodiment where the stator assembly 150 comprises inner 162 and outer stators 164. The superconductive field coil 170 is mounted on a ring shaped inner stator 162. A ring shaped outer stator 164 is located concentrically around the inner stator 162, such that the coil 170 is located between the inner 162 and outer 164 stators. Alternatively, the field coil 170 can be mounted on the outer stator 164 or on both the inner and outer stators. The rotor segments 106 and 108 comprising salient poles 112 and air poles 114 are located axially on either side of the stators 162, 164, as shown in FIG. 4. A plurality of such rotor/stator arrangements can be stacked axially along the rotor shaft 120 for long machines. The armature windings are not shown in FIG. 4 for clarity.

Figure 5:
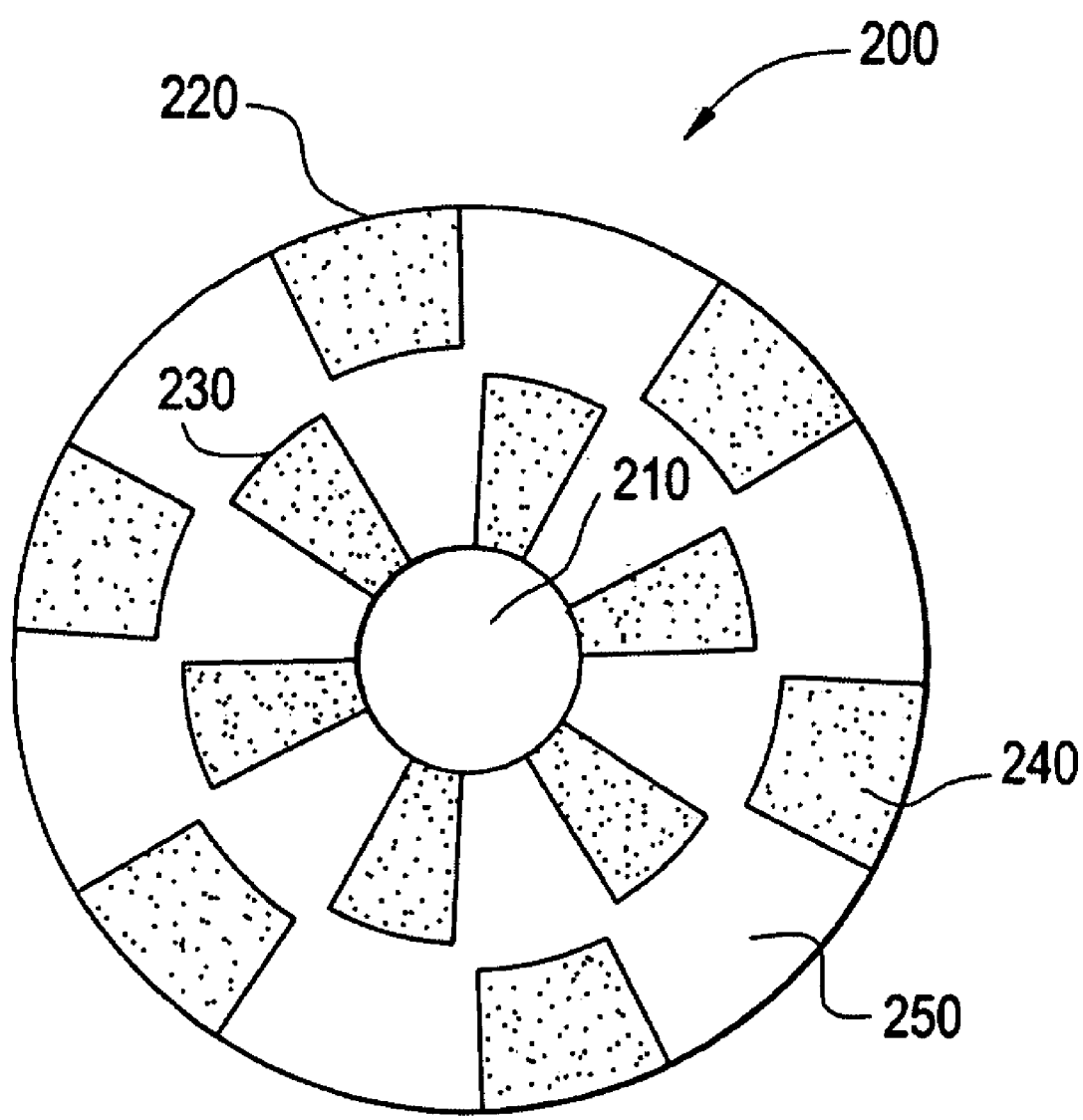
FIG. 5 is a plane view of an exemplary embodiment of a rotor segment for the machine shown in FIG. 2.

FIG. 5 is a plane view of an exemplary rotor segment 200 that can be used with machine 100 of FIG. 3. The rotor segment 200 includes a central portion 210 for engaging the shaft (see FIG. 3). This central portion 210 can be adapted to accommodate fixtures or adapters which secure the rotor segment 200 to the shaft. The rotor segment 200 is preferably formed of a disk-shaped base 250 that is divided into one or more concentric rings. Preferably, the base 250 is divided into a plurality of concentric rings, such as two rings 220, 230. In a preferred embodiment, the base 250 is made of a ferromagnetic material to allow flux to travel therewithin. Each ring is provided with a plurality of spaced-apart ferromagnetic poles 240 formed on a surface of the base 250. In a preferred embodiment, the salient ferromagnetic poles 240 are formed with iron plates mounted on the surface of the base 250. In another embodiment, the salient poles 240 are formed of laminated iron. In yet another embodiment, the salient poles 240 and the base 250 are of a unitary construction. Space between the ferromagnetic poles 240 forms air gaps, or air poles. The ferromagnetic poles 240 in adjacent rings are preferably offset by one pole pitch either within or between the concentric rings. Preferably, the salient poles 240 and the air poles therebetween are either annular sector shaped or trapezoidal shaped. Thus, a plurality of poles is formed in each ring such that the poles are circumferentially spaced apart.

Figure 6:
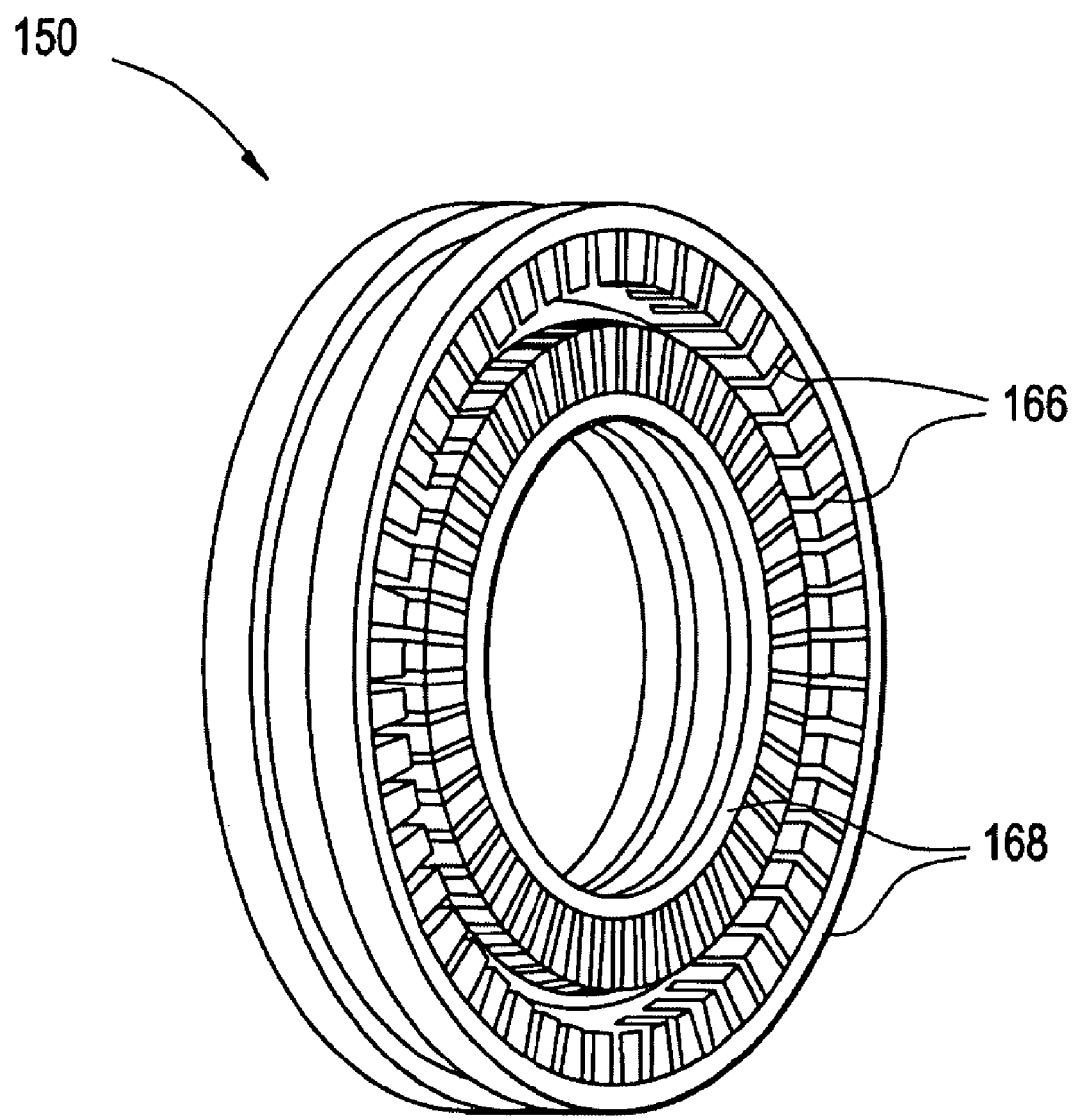
FIG. 6 is a perspective view of the assembled stator of FIG. 4.

FIG. 6 illustrates a three dimensional view of the stator assembly 150 with armature windings 166. The assembly 150 also includes end windings 168. The armature windings can be lap/wave windings. The stator assembly 150 is adapted to be housed between a pair of axially spaced-apart rotor segments, as illustrated in FIG. 3. The armature windings 166 are positioned between stator teeth along the circumferential perimeter on each side of the inner and outer stators.

Figure 7:
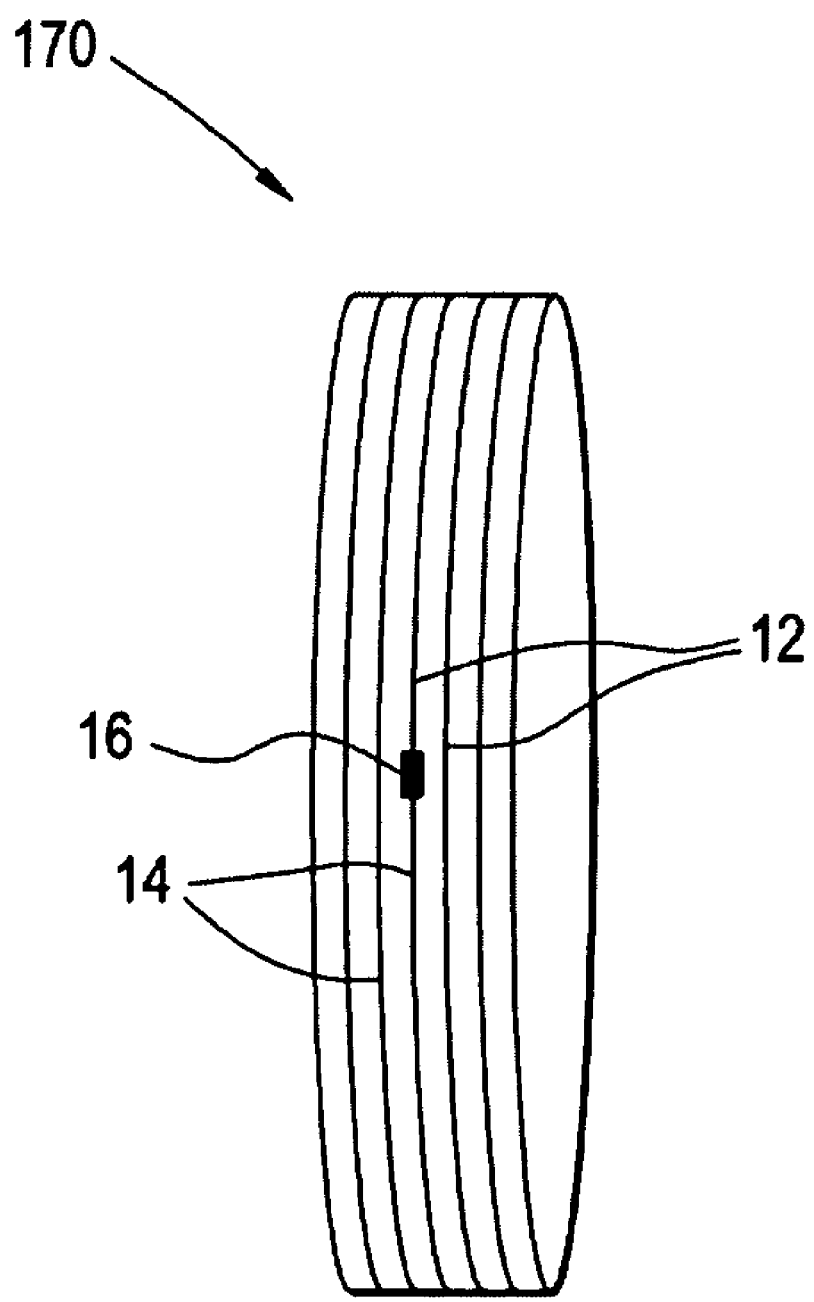
FIG. 7 is a schematic of a superconductive field coil comprising a superconductive wire having two wire segments.

FIG. 7 illustrates an embodiment of a superconductive field coil 170 comprising a functionally graded superconducting wire comprising two wire segments, 12 and 14 joined together by joint 16. Joint 16 can be generated during the winding process of forming field coil 170. The lengths of wire segments 12 and 14 depend on the magnetic field characteristics and field coil size, which can be readily determined by those of ordinary skill. Otherwise, the lengths are selected to concentrate the windings of the more field tolerant wire segment in the high field region produced by the field coil 170.

The superconductive field coil 170 is maintained at a temperature approaching zero Kelvin using a continuous supply of cryogenic fluid, such as, for example, but not limited to liquid helium (He). If a high temperature superconductor (HTS) is used in fabricating the field coil, a cryogenic fluid such as nitrogen ($N_2$) or liquid neon (Ne) can be used to achieve superconductive temperatures. The cryogenic fluid is typically supplied to the superconductive field coil from a stationary cryocooler. Any suitable cooling fluid devices, such as cooling fluid tubes or conduits can be provided in the stator assembly 150 to cool the superconductive field coil 170.

Although a superconductive field coil for a rotating machine has been used to exemplify a machine which can usefully employ a functionally graded superconductive wire, a variety of other power equipment can also benefit from functional grading of the superconductive wires within their coils, because all of these equipment can have varying conditions of magnetic field, temperature, or strain across their coils. Examples of such machines include MRI magnets, superconductive transformers, and motor/generators having superconductive armature windings.

In another embodiment the electrical component comprises a cable comprising one or more functionally graded superconductive wires comprising two or more joined wire segments wherein adjacent wire segments differ in at least one property selected from the group consisting of magnetic field tolerance, temperature tolerance, ac loss, and strain tolerance. In one embodiment the superconductive wires are wound around a central axis of the cable. In another embodiment, the superconductive wires are wound in more than one layer.

The above-described machines comprising a field coil exemplify non-limiting implementations of functionally graded superconductive wires. The wire segments of the field coil are positioned to dispose the most field tolerant wire segments within or in closest proximity to the highest field region produced by the field coil. This permits higher current to the field coil and improves torque density for a given coil size and configuration.

Other electrical generating systems are contemplated using electrical components comprising the functionally graded superconductive wires described herein. The systems are not limited to the specific embodiments described herein, but rather, components of each system can be utilized independently and separately from other components described herein. Each system component can also be used in combination with other system components.

Also disclosed is a process of forming a superconductive field coil comprising a superconductive wire comprising winding a first wire segment; joining a second wire segment to the first wire segment; and winding the second wire segment about the first wire segment, wherein the first wire segment and the second wire segment differ in at least one property selected from the group consisting of magnetic field tolerance, temperature tolerance, ac loss, and strain tolerance; and wherein the magnetic field tolerance is measured by the relationship of critical current Ic to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain. In one embodiment the wire segments are joined during the winding process. In one embodiment the wire segments are joined by welding. In one embodiment the wire segments are joined by diffusion bonding. In one embodiment the second wire segment comprises $Nb_3Sn$ and is positioned to define a high field region of the field coil, and the first wire segment comprises NbTi and is positioned to define a low-field region of the field coil, wherein the second magnetic field tolerance of the second wire segment is greater than the first magnetic field tolerance of the first wire segment.

The singular forms "a," "an," and "the" in the above description include plural referents unless the context clearly dictates otherwise. The endpoints of all ranges directed to the same characteristic or component are independently combinable and inclusive of the recited endpoint.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical component in the form of an armature winding or a field coil, comprising:
   a superconductive wire comprising:
   a first wire segment joined to a second wire segment, wherein the first wire segment comprises at least one superconductive filament comprising a superconductive composition comprised of NbTi and a dopant wherein the dopant is at least one of copper, gold, silver, magnesium, zinc, cadmium, tin, bismuth, gallium, mercury or indium; and
   wherein the second wire segment comprises at least one superconductive filament comprising a superconductive composition comprised of $Nb_3Sn$ and a dopant wherein the dopant is at least one of copper, gold, silver, magnesium, zinc, cadmium, tin, bismuth, gallium, mercury, or indium; and
   wherein either the first or second wire segment or both the first and second wire segment have a non-superconductive metal matrix surrounding the at least one superconductive filament and a metal layer disposed between the non-superconductive metal matrix and the at least one superconductive filament;
   wherein the first wire segment and the second wire segment differ in at least one of magnetic field tolerance, ac loss, and strain tolerance; and
   wherein the magnetic field tolerance is measured by the relationship of critical current Ic to magnetic field H at a given temperature T below critical temperature Tc, the ac loss is measured by the amount of ac loss versus the frequency and magnitude of applied ac currents and fields, and the strain tolerance is measured by critical current Ic degradation with strain.

2. The electrical component of claim 1, further comprising a plurality of adjacent layers or lengths of the superconductive wire.

3. The electrical component of claim 1, wherein the superconductive wire further comprises at least one additional wire segment joined to the second wire segment; wherein the at least one additional wire segment and the second wire segment differ in at least one property selected from the group consisting of magnetic field tolerance, temperature tolerance, ac loss, and strain tolerance.

4. The electrical component of claim 1, wherein the first and/or the second wire segment comprises more than one filament comprising a superconductive composition.

5. The electrical component of claim 1, wherein the non-superconductive metal matrix is copper or a copper alloy.

6. A machine, comprising
   an electrical component in the form of an armature winding or a field coil comprising a superconductive wire comprising n wire segments joined by n−1 joints wherein n is an integer greater than or equal to 2 and
   wherein a first wire segment of the superconductive wire comprises at least one superconductive filament comprising a superconductive composition comprised of NbTi and a dopant wherein the dopant is at least one of copper, gold, silver, magnesium, zinc, cadmium, tin, bismuth, gallium, mercury or indium; and
   wherein a second wire segment of the superconductive wire comprises at least one superconductive filament comprising a superconductive composition comprised of $Nb_3Sn$ and a dopant wherein the dopant is at least one of copper, gold, silver, magnesium, zinc, cadmium, tin, bismuth, gallium, mercury, or indium; and
   wherein either the first or second wire segment or both the first and second wire segment have a non-superconductive metal matrix surrounding the at least one superconductive filament and a metal layer disposed between the non-superconductive metal matrix and the at least one superconductive filament;
   wherein the first wire segment and the second wire segment differ in at least one of magnetic field tolerance, temperature tolerance, ac loss, and strain tolerance; and
   wherein the magnetic field tolerance is measured by the relationship of critical current Tc to magnetic field H at a given temperature T below critical temperature Tc, the temperature tolerance is measured by the relationship of critical current Ic to temperature T at a given magnetic field below critical magnetic field Hc, the ac loss is measured by the amount of ac loss versus the frequency and magnitude of applied ac currents and fields, and the strain tolerance is measured by critical current Ic degradation with strain.

7. The machine of claim 6, wherein the electronic component is a superconductive field coil.

8. The machine of claim 7, further comprising a rotor assembly comprising a rotatable shaft, and a stationary stator assembly comprising concentric inner and outer stators, wherein the superconductive field coil is stationary.

9. The machine of claim 6, wherein the machine is a motor.

10. The machine of claim 6, wherein the machine is a generator.

11. The machine of claim 10, wherein the generator is a component of a wind turbine assembly.

* * * * *